US009324447B2

(12) United States Patent
Chung

(10) Patent No.: US 9,324,447 B2
(45) Date of Patent: Apr. 26, 2016

(54) CIRCUIT AND SYSTEM FOR CONCURRENTLY PROGRAMMING MULTIPLE BITS OF OTP MEMORY DEVICES

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 0 days.

(21) Appl. No.: 14/085,228

(22) Filed: Nov. 20, 2013

(65) Prior Publication Data

US 2014/0269135 A1 Sep. 18, 2014

Related U.S. Application Data

(60) Provisional application No. 61/728,241, filed on Nov. 20, 2012.

(51) Int. Cl.
*G11C 17/00* (2006.01)
*G11C 17/16* (2006.01)
*G11C 17/14* (2006.01)

(52) U.S. Cl.
CPC .............. *G11C 17/16* (2013.01); *G11C 17/146* (2013.01); *G11C 17/165* (2013.01)

(58) Field of Classification Search
CPC .... G11C 17/16; G11C 17/165; G11C 17/143; G11C 11/146; G11C 17/18
USPC .............. 365/225.7, 96, 105, 230.03, 230.06
See application file for complete search history.

(56) References Cited

U.S. PATENT DOCUMENTS

| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |

(Continued)

FOREIGN PATENT DOCUMENTS

| CN | 1469473 A | 1/2004 |
| CN | 1691204 A | 11/2005 |

(Continued)

OTHER PUBLICATIONS

U.S. Appl. No. 13/471,704, filed May 15, 2012.
U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.

(Continued)

*Primary Examiner* — Tan T. Nguyen

(57) ABSTRACT

Circuits and systems for concurrently programming a plurality of OTP cells in an OTP memory are disclosed. Each OTP cell can have an electrical fuse element coupled a program selector having a control terminal. The control terminals of a plurality of OTP cells can be coupled to a plurality of local wordlines, and a plurality of the local wordlines can be coupled to at least one global wordline. A plurality of banks of bitlines can have each bitline coupled to a plurality of the OTP cells via the control terminal of the program selector. A plurality of bank selects can enable turning on the wordlines or bitlines in a bank. A plurality of the OTP cells can be configured to be programmable concurrently into a different logic state by applying voltages to at least one selected global wordline and at least one selected bitline to a plurality of the selected OTP cells in a plurality of banks, if a plurality of banks are enabled.

22 Claims, 8 Drawing Sheets

(56) References Cited

U.S. PATENT DOCUMENTS

| | | |
|---|---|---|
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A * | 6/1998 | Allan et al. ............. 365/230.06 |
| 5,962,903 A | 10/1999 | Sung et al. |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimormura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,833,823 B2 | 11/2010 | Klersy |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 * | 7/2013 | Chung ............................ 365/148 |
| 8,514,606 B2 | 8/2013 | Chung |
| 8,526,254 B2 | 9/2013 | Kurjanowicz et al. |
| 8,559,208 B2 * | 10/2013 | Chung ............................ 365/148 |
| 8,570,800 B2 * | 10/2013 | Chung ............................ 365/173 |
| 8,576,602 B2 | 11/2013 | Chung |
| 8,643,085 B2 | 2/2014 | Pfirsch |
| 8,644,049 B2 * | 2/2014 | Chung ............................ 365/96 |
| 8,648,349 B2 | 2/2014 | Masuda et al. |
| 8,649,203 B2 * | 2/2014 | Chung ............................ 365/148 |
| 8,760,904 B2 * | 6/2014 | Chung ............................ 365/96 |
| 8,817,563 B2 | 8/2014 | Chung |
| 8,830,720 B2 * | 9/2014 | Chung ............................ 365/96 |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Lie et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansal et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0312166 A1 | 12/2011 | Yedinak et al. |
| 2012/0032303 A1 | 2/2012 | Elkareh et al. |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |

(56) References Cited

U.S. PATENT DOCUMENTS

| | | |
|---|---|---|
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0124871 A1 | 5/2014 | Ko et al. |
| 2014/0124895 A1 | 5/2014 | Salzman et al. |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0211567 A1 | 7/2014 | Chung |
| 2014/0269135 A1 | 9/2014 | Chung |
| 2015/0021543 A1 | 1/2015 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 4/2009 |

OTHER PUBLICATIONS

U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rd. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp., Jun. 2004, pp. 442-445.
Bedeschi, F. et al., "SET and RESET Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive Ram (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.

(56) References Cited

OTHER PUBLICATIONS

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doorn, T. S. et al., "Ultra-fast Programming of Silicided Polysilicon Fuses Based on New Insights in the Programming Physics," IEEE IEDM, 2005, pp. 667-670.

Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunnel Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology,"7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.

Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H.Y. et al., "Low Power and High Speed Bipolar Switching with a Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

(56) References Cited

OTHER PUBLICATIONS

Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. On Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of A Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22/ Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.

(56) References Cited

OTHER PUBLICATIONS

Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.

(56) References Cited

OTHER PUBLICATIONS

Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-µ m shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Mar. 31, 2015.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.

* cited by examiner

CIRCUIT AND SYSTEM FOR CONCURRENTLY PROGRAMMING MULTIPLE BITS OF OTP MEMORY DEVICES

CROSS-REFERENCE TO RELATED APPLICATION

This application claims priority of U.S. Provisional Patent Application No. 61/728,241 filed on Nov. 20, 2012 and entitled "CIRCUIT AND SYSTEM OF CONCURRENTLY MULTIPLE BITS PROGRAMMABLE FOR OTP MEMORY DEVICES," and is hereby incorporated herein by reference.

BACKGROUND OF THE INVENTION

1. Field of the Invention

The present invention relates to programmable memory devices, particularly one-time programmable (OTP) devices, for use in memory arrays.

2. Description of the Related Art

A One-Time Programmable (OTP) device, such as electrical fuse, is a device that can be programmed only once. The programming means can apply a high voltage to induce a high current to flow through the OTP element. When a high current flows through an OTP element by turning on a program selector, the OTP element can be programmed, or burned into a high or low resistance state (depending on either fuse or anti-fuse).

An electrical fuse is a common OTP element that can be constructed from a segment of interconnect, such as polysilicon, silicided polysilicon, silicide, metal, metal alloy, or some combination thereof. The metal can be aluminum, copper, or other transition metals. One of the most commonly used electrical fuses is a CMOS gate, fabricated in silicided polysilicon or metal gate, used as interconnect. The electrical fuse can also be one or more contacts or vias instead of a segment of interconnect. A high current may blow the contact(s) or via(s) into a very high resistance state. The electrical fuse can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

A conventional OTP memory cell 10 is shown in FIG. 1. The cell 10 consists of an OTP element 11 and an NMOS program selector 12. The OTP element 11 is coupled to the drain of the NMOS 12 at one end, and to a high voltage V+ at the other end. The gate of the NMOS 12 is coupled to a select signal (Sel), and the source is coupled to a low voltage V−. When a high voltage is applied to V+ and a low voltage to V−, the OTP cell 10 can be programmed by raising the select signal (Sel) to turn on the NMOS 12. One of the most common OTP elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The resistive cell 10 can be organized as a two-dimensional array with all Sel's and V−'s in a row coupled as wordlines (WLs) and a ground line, respectively, and all V+'s in a column coupled as bitlines (BLs).

Another conventional OTP memory cell 15 is shown in FIG. 2. The OTP memory cell has an OTP element 16 and a diode 17 as program selector. The OTP element 16 is coupled between an anode of the diode 17 and a high voltage V+. A cathode of the diode 17 is coupled to a low voltage V−. By applying a proper voltage between V+ and V− for a proper duration of time, the OTP element 16 can be programmed into high or low resistance states, depending on voltage/current and duration. The diode 17 can be a junction diode constructed from a P+ active region on N well and an N+ active region on the same N well as the P and N terminals of a diode, respectively. In another embodiment, the diode 17 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The OTP cells 15 can be organized as a two-dimensional array with all V+'s in the same columns coupled together as bitlines (BLs) and all V−'s in the same rows coupled together as wordline bars (WLBs).

The program current of an OTP memory, especially for fuse memory, can be easily larger than 10 mA for CMOS generation above 40 nm and the program time can be easily longer than 10 us. If an OTP memory has 256 Kb, the total program time can be up to 2.56 seconds, which is unacceptably long in today's manufacturing. Long tester time results in higher costs. Normally, testing a chip requires only about 2-3 sec. maximum. If programming an OTP memory requires more than 1 sec, the cost of a chip using OTP would be too high.

In the past, programming a fuse memory is one bit at a time. This is partly because of high programming current incurred such that programming multiple bits at the same time would need very wide power and/or ground buses to handle high current. For example, if programming a bit requires 10 mA, programming 8 bits concurrently would require 80 mA. Even a 5 ohm resistance in the power or ground buses would have voltage drop of 400 mV. This is unacceptable high, especially the supply voltage has been reduced over the years from 5 Volts (V), to 3.3 V, even to about 1.2 V. Thus, there is a need for improved techniques and designs for concurrently programming bits of an OTP memory, such as fuse memory.

SUMMARY

Embodiments of circuits and systems for programming multiple bits concurrently for an OTP memory, such as fuse memory, are disclosed. The fuse memory can be programmed with more than one bit at the same time to save program time and costs.

In one embodiment, an OTP memory can have multiple banks with each bank select to enable at least one Y-write select. The Y-write selects can be generated from Y-decoders from the Y-address inputs. The bank selects can be obtained from data input during programming or latched data input before programming. If data input is high, the bank select can be asserted so that at least one Y-write select can turn on at least one selected bitline for programming along with the turning on of at least one wordline. If data input is low, the bank select can be de-asserted so that no bitlines can be turned on for the corresponding bank. As a result, each bank can be selected or de-selected for programming independently if the data input are asserted or de-asserted, respectively, to achieve concurrent multiple bit programming. Data input can be shared with the same I/O ports as the data output ports during read. The multiple-bit programming scheme is particularly suitable for using diodes as program selectors when the program currents can be very low. Thus, test time and costs can be reduced substantially for large density OTP memories.

Embodiments of the invention can be implemented in numerous ways, including as a method, system, device, or apparatus (including graphical user interface and computer readable medium). Several embodiments of the invention are discussed below.

As an OTP memory, one embodiment can, for example, include a plurality of One-Time Programmable (OTP) cells in a multiple-bank OTP memory. Each bank can have a plurality of wordlines, or the complements, that can be selected during programming. Each bank can also have a plurality of bitlines that can be selected by enabling at least one bank select signal and bitline selects during programming. The wordlines (or the complements), and the bitlines can be generated from the X- and Y-decoders from the X and Y address inputs, respectively. If a bank select is asserted, at least one bitline can be selected for programming, along with at least one selected wordlines (or complements). The bank select signals can be obtained from the data input, which can share the same I/O ports as data output during read. If the number of bits to be concurrently programmed is larger than the width of the I/O ports, the data input can be loaded and latched multiple times as bank selects.

As an electronics system, one embodiment can, for example, include at least a processor, and an OTP memory operatively connected to the processor. The OTP memory can include at least a plurality of OTP cells within multiple banks for data storage. Each bank can have a plurality of wordlines, or complements, that can be selected during programming. Each bank can also have a plurality of bitlines that can be selected by enabling at least one bank select and at least one bitline during programming. The wordlines (or the complements), and the bitlines can be generated from the X- and Y-decoders from the X and Y address inputs, respectively. If a bank select is asserted, at least one bitline can be selected from the corresponding bank for programming along with at least one selected wordlines (or complements). As a result, each bank can be asserted or de-asserted for programming, depending on the bank select to achieve concurrent multiple-bit programming. The bank selects can be obtained from data input during programming or latched data input before programming. Data input for bank select can be shared with the same I/O ports as data output during read. The multiple-bit programming scheme is particularly suitable for using diodes as program selectors when the program current can be very low. Thus, test time and costs can be reduced substantially for large density OTP memories.

As a method for providing a concurrent multiple-bit programmable One-Time Programmable (OTP) memory, one embodiment can, for example, include at least providing an OTP memory with a plurality of OTP cells, and concurrently programming a logic state into at least one of the OTP cells by turning on at least one selected wordline (or complement) and at least one of the bitline in at least one bank. The concurrent multiple-bit programming OTP can include at least (i) a multiple-bank OTP cell array that has a plurality of wordlines (or complements) and a plurality of bitlines to be selected, (ii) a plurality of bank selects to enable turning on at least one selected bitlines in a plurality of banks so that a plurality of OTP cells can be programmed concurrently, if at least one wordline is also turned on, and (iii) a scheme to input data as the bank selects. The bank selects can be input and/or latched from the I/O ports by sharing the same I/O ports with data output during read.

BRIEF DESCRIPTION OF THE DRAWINGS

The present invention will be readily understood by the following detailed descriptions in conjunction with the accompanying drawings, wherein like reference numerals designate like structural elements, and in which:

FIG. 5($b$) shows a portion of Y decoder block that has a plurality of Y address buffers, Y pre-decoders, and Y-decoders according to one embodiment.

FIG. 5($c$) shows a portion of an exemplifying Y decoder block according to another embodiment.

DETAILED DESCRIPTION OF EMBODIMENTS OF THE INVENTION

Circuits and systems for concurrently programming a plurality of OTP cells in an OTP memory are disclosed. An OTP memory can have a plurality of OTP cells. Each OTP cell can have an electrical fuse element coupled a program selector. The program selector can have a control terminal. The control terminals of a plurality of OTP cells can be coupled to a plurality of local wordlines that have a first resistivity. A plurality of the local wordlines can be coupled to at least one global wordline that has a second resistivity. A plurality of banks of bitlines that can have each bitline coupled to a plurality of the OTP cells via the control terminal of the program selector. A plurality of bank selects can enable turning on the wordlines or bitlines in a bank. A plurality of the OTP cells can be configured to be programmable concurrently into a different logic state by applying voltages to at least one selected global wordlines and at least one selected bitlines to a plurality of the selected OTP cells in a plurality of banks, if a plurality of bank selects are asserted.

The program selector can be a MOS device or a junction diode fabricated from a standard CMOS technology. The OTP element can be polysilicon, silicided polysilicon, silicide, polymetal, metal, metal alloy, local interconnect, metal-0, thermally isolated active region, CMOS gate, or combination thereof.

Embodiments disclosed herein can use a plurality of bank selects to enable each bank independently for concurrent multiple-bit programming. A multiple-bank OTP memory can have a plurality of wordlines (or complements) and a plurality of bitlines for a plurality of banks. The wordlines or bitlines can be generated from the X- and Y-decoders from the X and Y address inputs, respectively. If bank selects for a plurality of banks are asserted, at least one bitline can be selected from the plurality of banks, along with at least one wordline can be selected, to implement programming. The bank selects can be obtained from data inputs and can share the same I/O port with data output during read. The bank selects can be latched from data inputs multiple times before programming.

Several embodiments of the invention are discussed below with reference to FIGS. 3-8. However, those skilled in the art will readily appreciate that the detailed description given herein with respect to these figures is for explanatory purposes as the invention extends beyond these limited embodiments.

Figure 1:
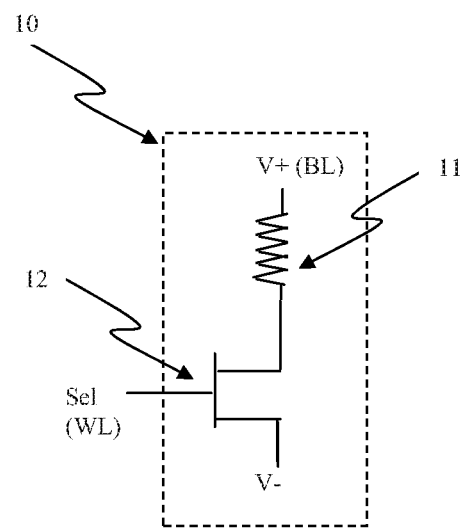
FIG. 1 shows a conventional OTP cell using MOS as a program selector in a prior art.
Figure 2:
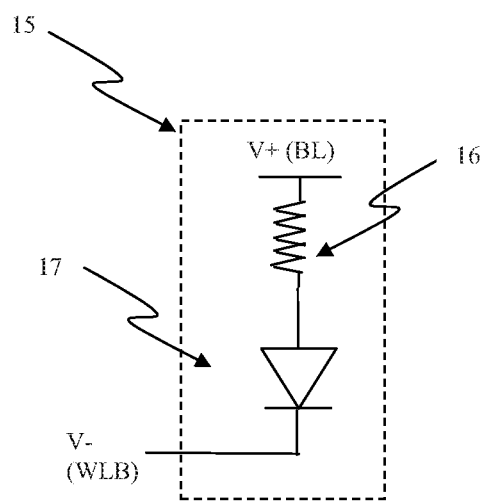
FIG. 2 shows another conventional OTP cell using diode as a program selector.
Figure 3:
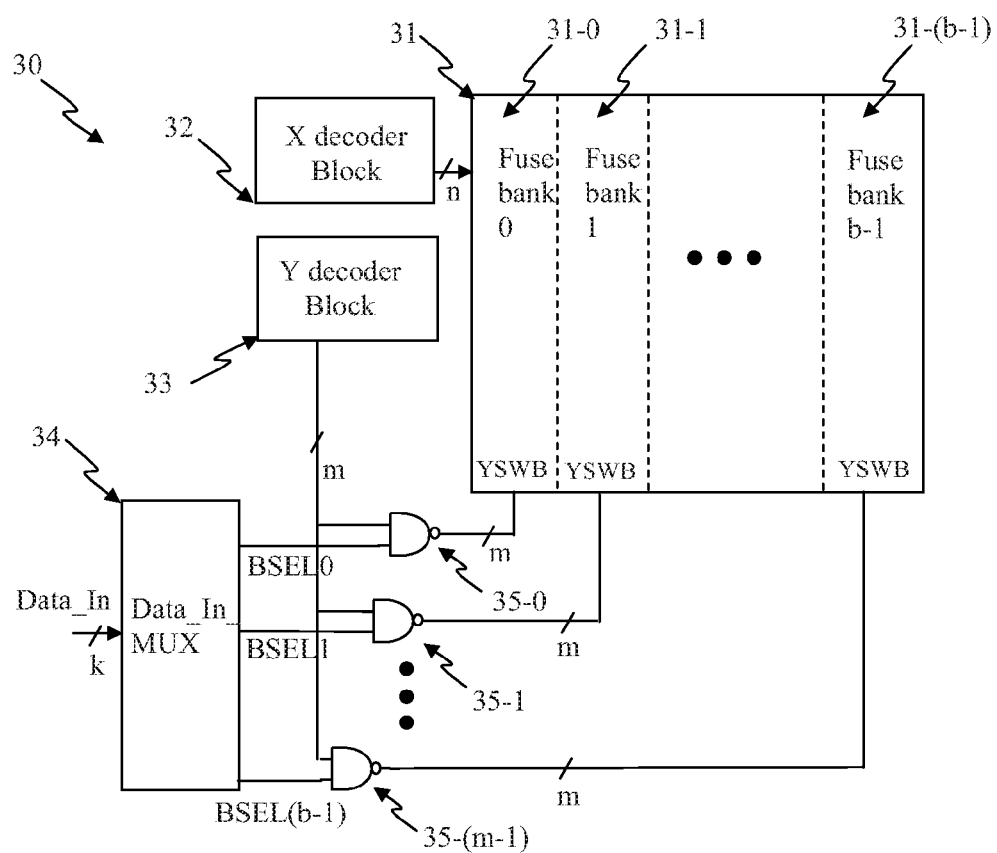
FIG. 3 shows a block diagram of a portion of concurrent multi-bit programmable OTP memory according to one embodiment.

FIG. 3 shows a block diagram of a portion of a multiple-bit concurrently programmable OTP memory 30 according to one embodiment. The OTP memory 30 has at least one OTP memory array 31 that has b banks of OTP memory 31-0 through 31-(b−1). X decoder block 32 generates n rows of wordlines (or complements) to be selected for at least one row in the OTP memory array 31 for programming. Y decoder block 33 generates m columns of bitlines to be selected for at least one column in at least one bank for programming. Data_In_MUX 34 generates a set of b bank selects, BSEL0 through BSEL(b−1), from k bits of data input (Data_In). If the number of the bank selects is not more than the width of the data input, the data input in part or all can be used as bank selects. If the number of the bank selects is larger than width of the data input, the data can be input several times and latched as bank selects. The bank selects can further undergo a logical AND with the m column selects from the Y decoder block 33 outputs in gates 35-0 through 35-(m−1) to enable selecting at least one bitline in a bank independently. For example, if all bank selects, BSEL0-BSEL(b−1), are asserted, a column specified by the m bits of the Y-decoder block 33 output of all banks can be programmed at the same time, if at least one wordline is also selected. Similarly, if only BSEL0 is asserted, but all the other bank selects are deasserted, only bank 0 can be programmed to at least one bitline specified by the Y decoder block 33 output, if at least one wordline is also selected.

The above discussions are for illustrative purposes. The number of cells may vary. The numbers of rows n, columns m per bank, banks b, or data bus width k may vary. The number of banks and the number of bits to be programmable concurrently are not necessarily the same, though it is more convenient to do so. The row and column can be interchangeable. The AND gates, 35-0 through 35-(b−1), can be built as part of the Y-decoder block 33 to be functional equivalent to enable at least one bitline from at least one bank, if the corresponding bank select is asserted. The numbers of bits that can be programmed concurrently may vary for each programming cycle depending on how many bank selects are asserted, as long as they do not exceed a maximum number b, in the above example. There are many variations and equivalent embodiments and that they are all within the scope of this invention for those skilled in the art.

Figure 4:
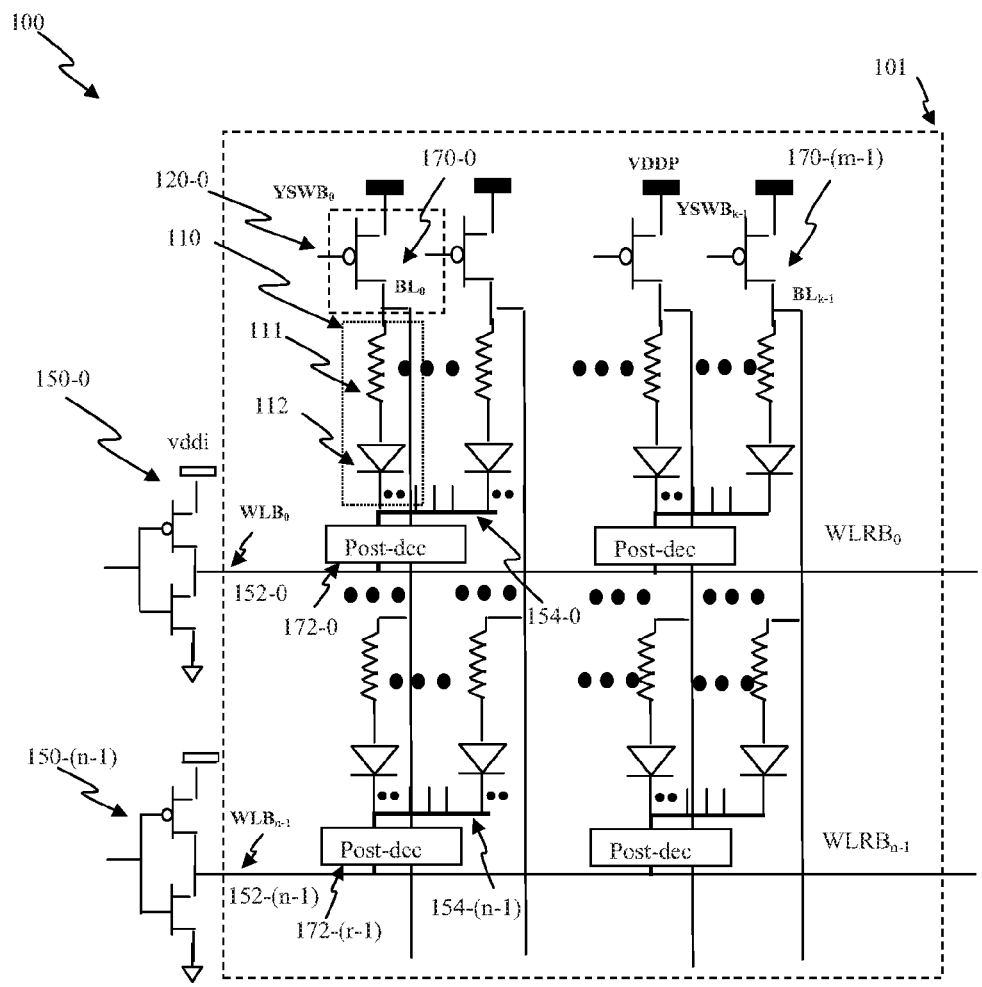
FIG. 4 shows a schematic of a portion of one bank in an OTP memory according to one embodiment.

FIG. 4 shows a portion of a schematic diagram of a portion of an OTP memory bank 100 according to one embodiment. The OTP memory bank 100 can be constructed by an array 101 of n-row by m-column using diode-as-program-selector cells 110 and n wordline drivers 150-i, where i=0, 1, ..., n−1, in accordance with one embodiment. The memory array 101 has m columns to be selected for programming. Each of the memory cells 110 has an OTP element 111 coupled to the P terminal of a diode 112 as program selector and to a bitline BLj 170-j (j=0, 1, ... m−1) for those of the memory cells 110 in the same column. The N terminal of the diode 112 is coupled to a wordline WLBi 152-i through a local wordline LWLBi 154-i, where i=0, 1, ..., n−1, for those of the memory cells 110 in the same row. Each wordline WLBi is coupled to at least one local wordline LWLBi, where i=0, 1, ..., n−1. The LWLBi 154-i is generally constructed by a high resistivity material, such as N well, polysilicon, polymetal, local interconnect, metal-0, active region, or metal gate to connect cells, and then coupled to the WLBi (e.g., a low-resistivity metal WLBi) through conductive contacts or vias, buffers, or post-decoders 172-i, where i=0, 1, ..., n−1. Buffers or post-decoders 172-i may be needed when using diodes as program selectors because there are currents flowing through the WLBi, especially when one WLBi drives multiple cells for program simultaneously in other embodiments. The wordline WLBi is driven by the wordline driver 150-i with a supply voltage vddi that can be switched between different voltages for program and read. Each BLj 170-j is coupled to a supply voltage VDDP through a Y-write pass gate 120-j for programming, where each BLj 170-j is selected by YSWBj (j=0, 1, ..., m−1). The Y-write pass gate 120-j (j=0, 1, ..., m−1) can be built by PMOS, though NMOS, diode, or bipolar devices can be employed in some embodiments. To program a cell, the specific WLBi and YSWBj can be turned on to select a wordline and a bitline, respectively, when a high voltage is supplied to VDDP, where i=0, 1, ... n−1 and j=0, 1, ..., m−1. Thus, an OTP memory cell can be programmed into a desirable state. For those skilled in the art understand that the above descriptions are for illustrative purpose. Various embodiments of array structures, configurations, and circuits are possible and are still within the scope of this invention.

Figure 5A:
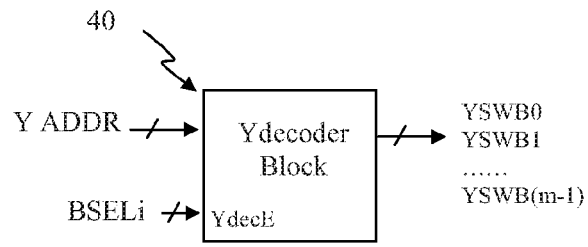
FIG. 5($a$) shows a block diagram of a Y-decoder block with a bank select according to one embodiment.

FIG. 5(a) shows a portion of an Y decoder block 40, corresponding to the Y decoder block 33 and AND gates 35-i (i=0, 1, 2, ..., m−1) in FIG. 3, according to another embodiment. The Y decoder block 40 consists of a plurality of Y decoders enabled by a bank select (BSELi) to generate Y Write Selects YSWB0-YSWB(m−1) for bank i with a plurality of Y address (YADDR) inputs, where i=0, 1, ..., b−1. The Y decoder block can be replicated for the other banks, though some of the circuits can be shared.

Figure 5B:
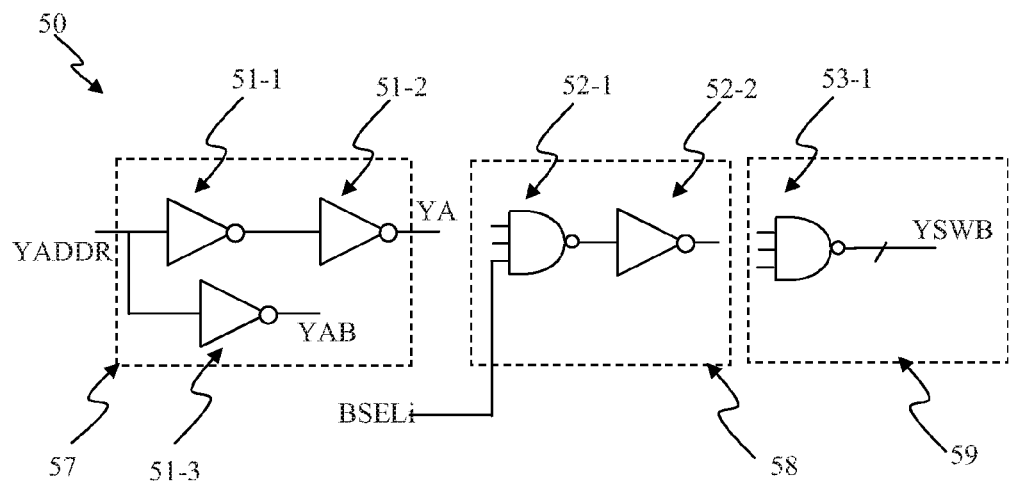

FIG. 5(b) shows a portion of an Y decoder block 50, corresponding to the Y decoder block 40 in FIG. 5(a), according to one embodiment. The Y decoder block 50 has at least one Y address buffer 57, at least one Y pre-decoder 58, and at least one Y decoder 59. The Y address buffer 57 has at least one input from Y address (YADDR) to generate true and complement of Y addresses, YA and YAB, through buffers 51-1 and 51-2, and 51-3, respectively. The Y pre-decoder 58 has at least one multiple-input NAND 52-1 followed by an inverter as a buffer 52-2. The NAND 52-1 can have at least one input from the buffered Y address and a bank select BSELi, i=0, 1, ..., b−1. The Y decoder 59 has at least one multiple-input NAND 53-1 and followed by none, one , , , or a suitable number of buffers to generate Y-Write Selects YSWB0-YSWB(m−1). The bank select BSELi can be gated with the Y address in the Y address buffer 57, or in the Y decoder 59, in other embodiments. The Y address buffers can be replicated for as many times as the Y address inputs. The outputs of the buffered Y addresses can be input to a plurality of Y pre-decoders 58 to pre-decoder the Y address space partially. Furthermore, the outputs of the Y pre-decoders 58 can be input to a plurality of Y decoders 59 to fully decode the available Y addresses. In this example, there are m*b YSWB signals to be generated from the Y decoder block 50 for m columns in b banks, and up to b YSWB signals can be asserted, one for each bank.

The X decoder block 32 in FIG. 3 can be implemented similarly to the Y decoder block 50 in FIG. 5(b) in other embodiment, except that the BSELi can be changed into a single or a plurality of wordline enables. More generally, the number of inputs and stages of multiple-input NAND gates may vary, depending on the number of the Y addresses and pre-decoding/decoding schemes. The NAND gates can be replaced by equivalent NOR gates or equivalent Boolean logic in other embodiments. The numbers of buffers may vary. In other embodiments, the number of banks and the maximum number of bits that can be programmed concurrently do not have to be the same, thought it is more convenient to design this way.

Figure 5C:
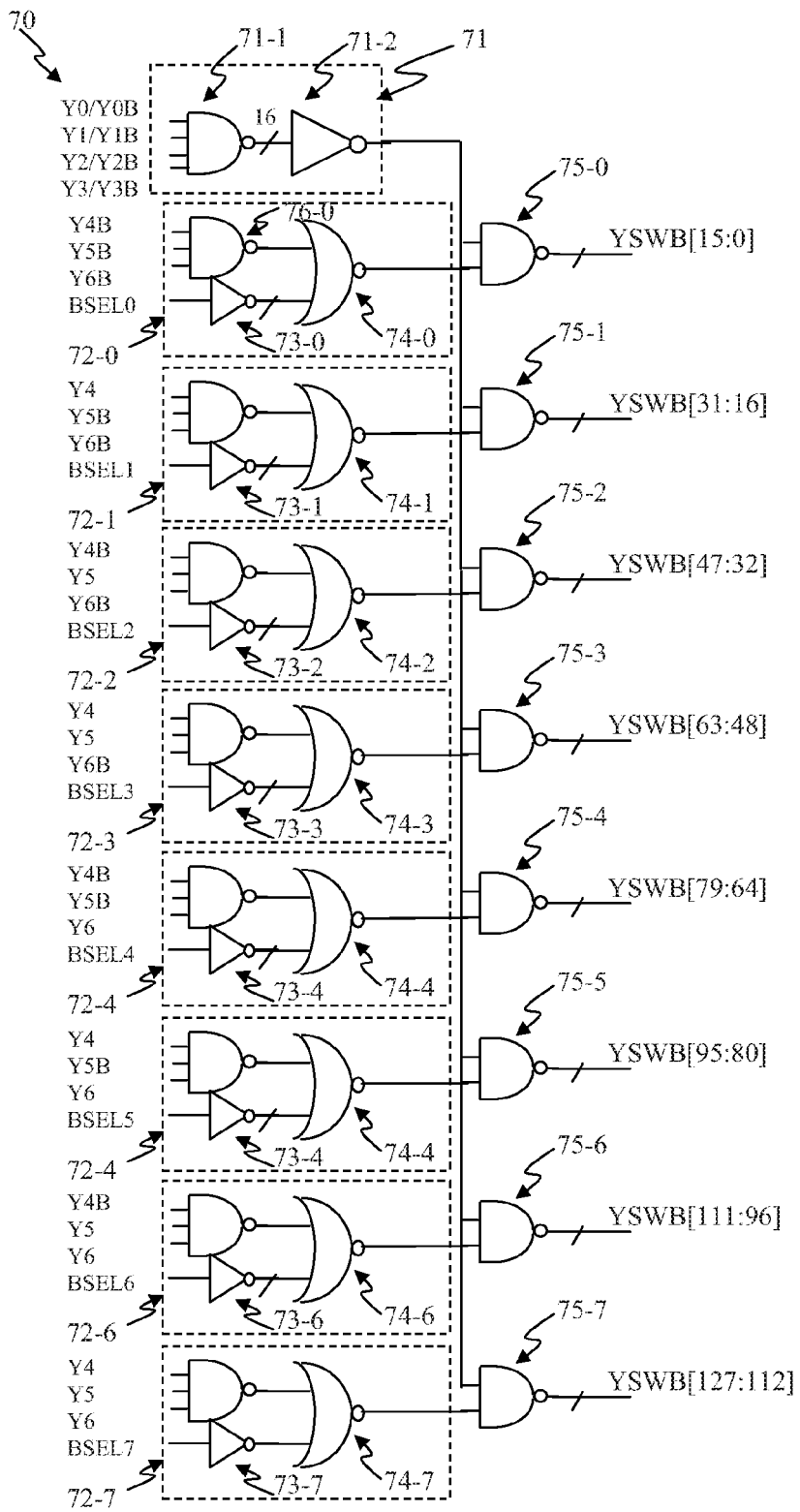

FIG. 5(c) shows a portion of an exemplifying Y decoder block 70 according to another embodiment. The Y decoder block 70 can fully decode into 128 Y select lines from 7 Y addresses for an OTP memory. The OTP memory has 8 banks, 0 to 7, that can be decoded from the upper 3 Y addresses Y5, Y6, and Y7, in the increment order. A Y pre-decoder 71 has a 4-input NAND 71-1 with inputs from Y0-Y3 address buffers and followed by an inverter 71-2 as a buffer. Another pre-decoder block 72-0 has a 3-input NAND 76-0 with inputs from Y4B, Y5B, and Y6B and another inverter 73-0 with bank select BSEL0 as input. The outputs of the gates 76-0 and 73-0 are inputs to an NOR 74-0 to generate a bank select output. The pre-decoder outputs of Y0B, Y1B, and Y2B are combined with the bank select output to generate 16 Y-write selects 15 through 0 in a two-input NAND 75-0. The Y-write selects from 16 to 127 for bank 1 through 7 can be generated similarly in the other gates 76-i, 73-i, 74-i, and 75-i, respectively, where i=1, 2, 3, . . . 7. By asserting a plurality of bank selects, BSLE0-BSEL7, a plurality of Y-write selects YSWBs can be selected, at most one in each bank. As a consequence, a plurality of bitlines can be selected for concurrent multiple-bit programming, if at least one wordline is also selected.

Figure 6:
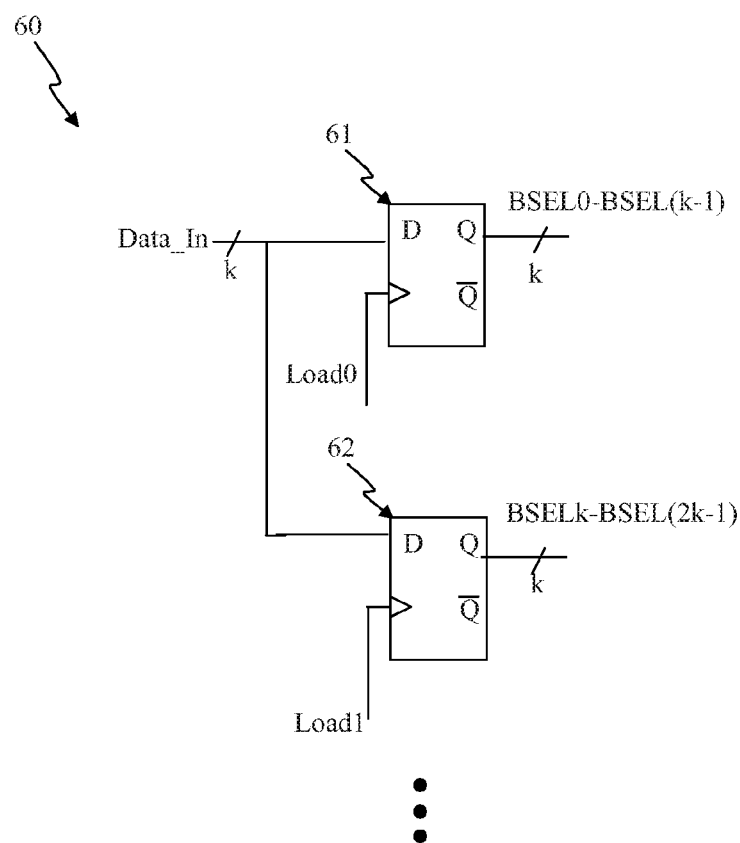
FIG. 6 shows a portion of a schematic diagram to latch data input as bank selects according to one embodiment.

FIG. 6 shows a portion of a schematic diagram of a data input mux 60 as Data_In_MUX shown in FIG. 3 according to one embodiment. The Data_In_MUX is a circuit block for generating bank select signals based on the data input from I/O ports, especially when the numbers of bits to be programmed concurrently are larger than the I/O port width. The Data_In_MUX can have as many inputs as the width of the I/O ports for Data_In. Each Data_In signal can be coupled to at least one latch or register 61 for bank selects. When a load signal, Load0, is asserted, the input data Data_In can be latched into the latches or registers 61 as bank selects from BSEL0 to BSEL(k−1), if k is the width of the I/O ports. Similarly, the bank selects from BSELk to BSEL(2k−1) can be latched into latches or registers 62 by asserting another load signal Load1 subsequently. This process can continue until all bank selects are loaded with proper values. These values can determine the corresponding banks being programmed or not in the next programming cycle. The processes of loading bank selects can be performed before each programming cycle. If the width of the I/O ports k is larger than the numbers of bits to be programmed concurrently, the latches or register can be omitted in other embodiments.

The OTP memory in the above discussions can include many different types of OTP elements. The OTP element can be an electrical fuse including a fuse fabricated from an interconnect, contact/via fuse, contact/via anti-fuse, or gate oxide breakdown anti-fuse. The interconnect fuse can be formed from silicide, polysilicon, silicided polysilicon, poly-metal, metal, metal alloy, local interconnect, metal-0, thermally insulated active region, or some combination thereof, or can be constructed from a CMOS gate. For the electrical fuse fabricated from an interconnect, contact, or via fuse, programming requirement is to provide a sufficiently high current, about 4-20 mA range, for a few microseconds to blow the fuse by electro-migration, heat, ion diffusion, or some combination thereof. For anti-fuse, programming requirement is to provide a sufficiently high voltage to breakdown the dielectrics between two ends of a contact, via or CMOS gate/body. The required voltage is about 6-7V for a few millisecond to consume about 100 uA of current for an OTP cell in today's technologies.

The OTP memory in the above discussions can include many different types of program selectors. The program selectors can be at least a MOS device that can be either NMOS or PMOS in bulk or SOI CMOS, in planar or FinFET technologies. The drain of the MOS device can be coupled to the OTP element and the gate of the MOS device can be coupled to a wordline. The program selector can also be a diode having at least a first active region with a first type of dopant to provide a first terminal of the diode, and an isolated second active region with a second type of dopant to provide a second terminal of the diode, both active regions being fabricated from sources or drains of CMOS devices and residing in a common CMOS well, the first terminal of the diode coupled to a first terminal of the OTP element and the second terminal of the diode can be coupled to a wordline complement. The isolation between the first and the second active region can be via STI, LOCOS, dummy MOS gate, or silicide block layer.

Figure 7:
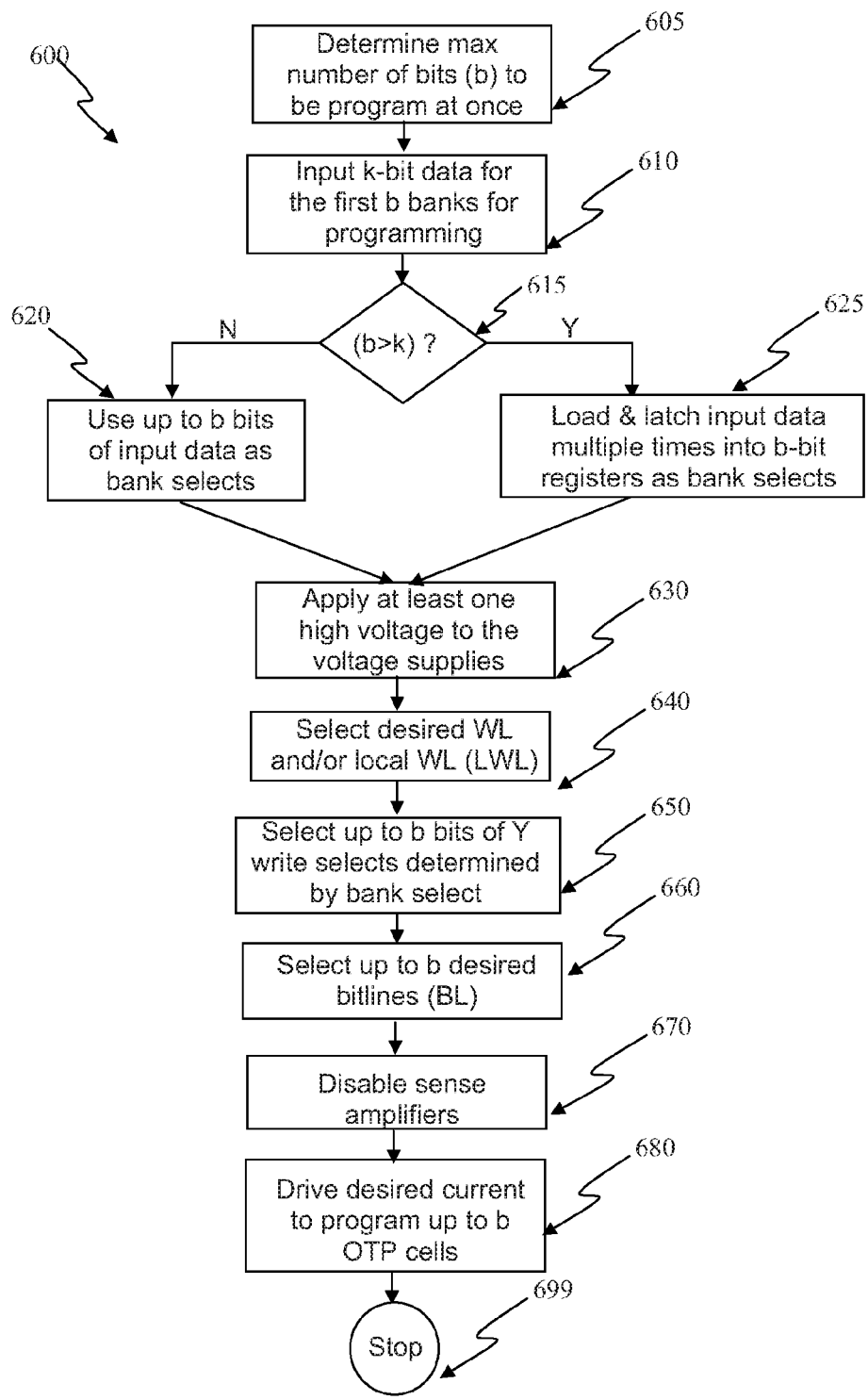
FIG. 7 depicts a method of programming multiple bits in an OTP memory concurrently according to one embodiment.

FIG. 7 depicts a flow diagram of a method 600 for programming a multi-bit programmable OTP memory in accordance with one embodiment. In the first step 605, determine a maximum number of bits, b, to be programmed concurrently. In the step 610, input k-bit data from I/O ports as bank selects. In the step 615, compare the number of bits b to be concurrently programmed with the width of the I/O ports k. If the number of bits to be programmed concurrently is not more than the width of the I/O ports, just use up to b bits in the I/O ports as bank selects in step 620. If not, load and latch the k-bit input data from the I/O ports multiple times until all bank select registers have been updated in step 625. Then apply at least one high voltage as voltage supplies for programming in step 630. The next step is to select the at least one desired wordline (WL) and local wordline (LWL) to select at least one row in step 640. Then select up to b bits of the Y write selects determined by the bank selects in step 650 where the bank selects were input or latched from the I/O ports. After Y write selects are asserted, up to b columns of bitlines can be selected for programming in step 660. The sense amplifiers for read can be disabled in step 670 to save power and to avoid interfering with the program operation. Finally, proper currents can be driven to a plurality of OTP cells, up to b OTP cells, selected for programming concurrently in step 680. Then, the process of programming multiple bits concurrently stops in 699 until the next programming cycle.

FIG. 7 shows a flow chart depicting embodiments of a program method 600 for concurrently programming multiple bits of a programmable OTP memory in accordance with certain embodiments. The method 600 is described in the context of a One-Time Programmable (OTP) memory, and more particularly a fuse memory, such as the OTP memory block 100 in FIG. 4. In addition, although described as a flow of steps, one of ordinary skilled in the art will recognize that at least some of the steps may be performed in a different order, including simultaneously, or skipped.

Figure 8:
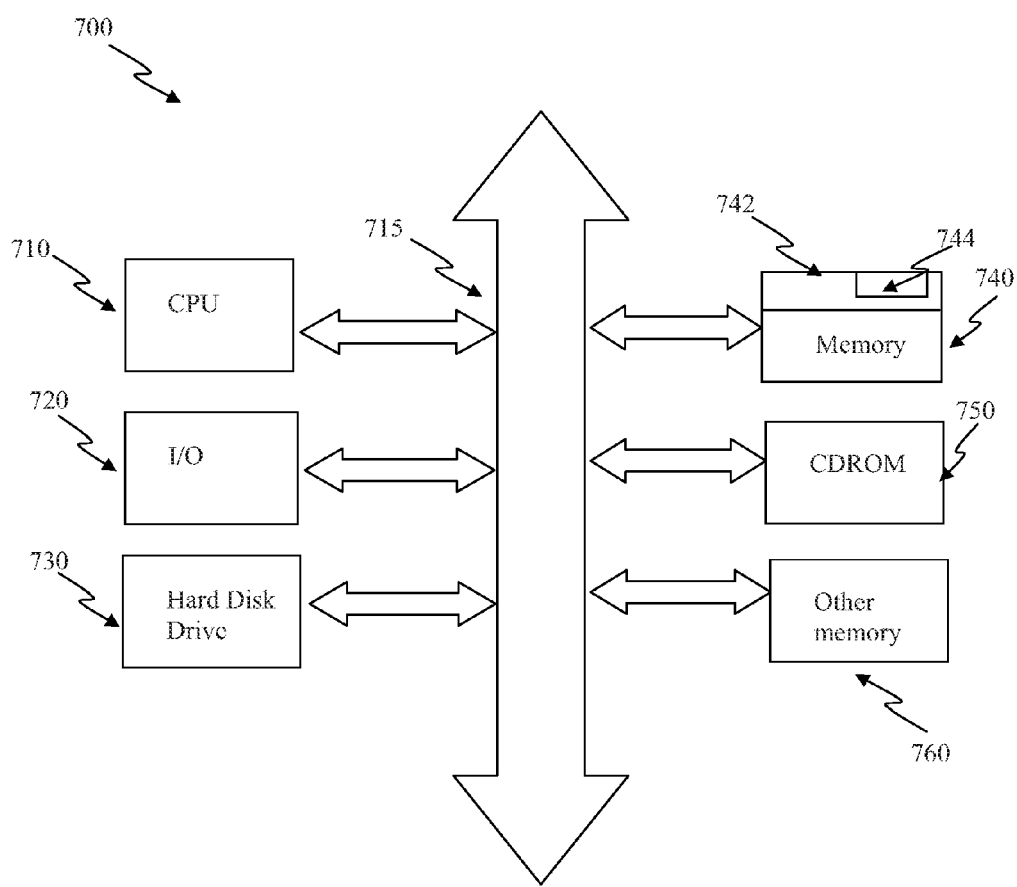
FIG. 8 shows a processor system including at least one multi-bit concurrently programmable OTP memory according to one embodiment.

FIG. 8 shows a processor system 700 according to one embodiment. The processor system 700 can include at least one OTP device 744, such as in a cell array 742, in multiple-bit concurrently programmable OTP memory 740, according to one embodiment. The processor system 700 can, for example, pertain to a computer system. The computer system can include a Central Process Unit (CPU) 710, which communicate through a common bus 715 to various memory and peripheral devices such as I/O 720, hard disk drive 730, CDROM 750, memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Programmable OTP Memory 740 is preferably constructed as an integrated circuit, which includes the memory array 742 having at least one OTP device 744. If desired, the memory 740 may be combined with the processor, for example CPU 710, in a single integrated circuit.

The invention can be implemented in a part or all of an integrated circuit in a Printed Circuit Board (PCB), or in a system. The OTP memory can be a fuse memory such as interconnect fuse, contact fuse, or via fuse. The fuse can be silicided or non-silicided polysilicon fuse, thermally insulated active-region fuse, local interconnect fuse, metal-0 fuse, metal fuse, contact fuse, via fuse, or fuse constructed from CMOS gates. The contact or via fuse can be a single or a plurality of contact or via to be programmed into a high resistance state.

This application also incorporates by reference the following: (i) U.S. patent application Ser. No. 13/471,704, filed on May, 15, 2012 and entitled "Circuit and System of Using Junction Diode as Program Selector For One-Time Programmable Devices," which is hereby incorporated herein by reference; (ii) U.S. patent application Ser. No. 13/026,752, filed on Feb. 14, 2011 and entitled "Circuit and System of Using Junction Diode as Program Selector for One-Time Programmable Devices," which is hereby incorporated herein by reference; (iii) U.S. Provisional Patent Application No. 61/375,653, filed on Aug. 20, 2010 and entitled "Circuit and System of Using Junction Diode As Program Selector for Resistive Devices in CMOS Logic Processes," which is hereby incorporated herein by reference; (iv) U.S. Provisional Patent Application No. 61/375,660, filed on Aug. 20, 2010 and entitled "Circuit and System of Using Polysilicon Diode As Program Selector for Resistive Devices in CMOS Logic Processes," which is hereby incorporated herein by reference; and (v) U.S. patent application Ser. No. 13/026,656, filed on Feb. 14, 2011 and entitled "Circuit and System of Using Polysilicon Diode As Program Selector for One-Time Programmable Devices," which is hereby incorporated herein by reference;

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An One-Time Programmable (OTP) memory capable of multiple-bit programming, comprising:
a plurality of OTP cells, at least one of the OTP cells including an electrical fuse element coupled to a program selector, the program selector having a control terminal;
a plurality of local wordlines, each coupled to a plurality of the OTP cells via the control terminal of the program selector and having a first resistivity;
a plurality of global wordlines, each coupled to at least one of the local wordlines and having a second resistivity; and
a plurality of banks of bitlines, each bitline coupled to a plurality of the OTP cells;
a plurality of bank selects to enable turning on the wordlines or bitlines in a bank; and
wherein a plurality of OTP cells can be configured to be concurrently programmable by applying at least one voltage to at least one wordline and at least one bitline in a plurality of banks if a plurality of the bank selects are asserted.

2. An OTP memory as recited in claim 1, wherein the electrical fuse element is at least one of an interconnect, a conductive contact or via, or combination thereof.

3. An OTP memory as recited in claim 2, wherein the electrical fuse element has at least one of polysilicon, silicided polysilicon, silicide, polymetal, local interconnect, metal-0, thermally insulated active region, metal, or metal alloy, CMOS gate, or combination thereof.

4. An OTP memory as recited in claim 1, wherein the at least one of the bank selects is driven from an I/O port that also serves as a data output port during read.

5. An OTP memory as recited in claim 1, wherein the at least one of the bank select is latched from an I/O port that also serves as a data output port during read.

6. An OTP memory as recited in claim 1, wherein the program selector is at least one MOS device with the MOS gate as the control terminal.

7. An OTP memory as recited in claim 1, wherein the program selector comprises at least one diode having at least a first active region with a first type of dopant to provide a first terminal of the diode, and a second active region with a second type of dopant to provide a second terminal of the diode, both active regions being fabricated from sources or drains of CMOS devices and residing in a common CMOS well, the first terminal of the diode coupled to a first terminal of the electrical fuse element, and the second terminal of the diode is the control terminal.

8. An OTP memory as recited in claim 1, wherein the local wordline is at least partially formed from at least one CMOS well.

9. An OTP memory as recited in claim 1, wherein the global wordline is constructed of metal.

10. An OTP memory as recited in claim 1, wherein the global wordline is coupled to the local wordline through at least one of conductive via or contact.

11. An OTP memory as recited in claim 1, wherein the OTP memory further comprises:
a plurality of write bitline selectors to select at least one of the bitlines coupled to a first supply voltage line; and
a plurality of wordline drivers to select at least one of the local wordlines coupled to a second supply voltage line to conduct currents through a plurality of the OTP cells during programming.

12. An One-Time Programmable (OTP) memory capable of concurrent multi-bit programming, comprising:
a plurality of OTP cells, each of the OTP cells including (i) an electrical fuse element as an OTP element, and (ii) a diode as program selector having at least a first active region with a first type of dopant to provide a first terminal of the diode, and a second active region with a second type of dopant to provide a second terminal of the diode, both active regions being fabricated from sources or drains of CMOS devices and residing in a common CMOS well, the first terminal of the diode coupled to a first terminal of the OTP element;

a plurality of local wordlines, each coupled to a plurality of the OTP cells via the second terminal of the diodes;

a plurality of global wordlines, each coupled to at least one of the local wordlines; and a plurality of bitlines arranged in banks, each bitline coupled to a plurality of the OTP cells via a second terminal of the OTP element; and.

wherein a plurality of OTP elements being configured to be concurrently programmable by applying at least one voltage to at least one wordline and at least one bitline coupled to a plurality of the OTP cells in a plurality of the banks.

13. An OTP memory as recited in claim 12, wherein the electrical fuse element has at least one of polysilicon, silicided polysilicon, silicide, polymetal, local interconnect, metal-0, thermally insulated active region, metal, or metal alloy, CMOS gate, or combination thereof.

14. An OTP memory as recited in claim 12, wherein the OTP memory further comprises a plurality bank selects that enable turning on the wordlines or bitlines in a bank, and wherein the at least one of the bank selects is driven or latched from an I/O port that also serves as a data output port during read.

15. An OTP memory as recited in claim 12, wherein the local wordline is at least partially formed of CMOS well and/or the global wordline is constructed of metal.

16. An electronics system, comprising:
a processor; and
at least one multiple-bit concurrently programmable OTP memory operatively connected to the processor, the OTP memory comprising:
  a plurality of OTP cells, each including an electrical fuse element coupled to a program selector, the program selector having a control terminal;
  a plurality of local wordlines, each coupled to a plurality of the OTP cells via the control terminal of the program selector;
  a plurality of global wordlines, each coupled to at least one of the local wordlines; and
  a plurality of bitlines arranged in banks, each bitline coupled to a plurality of OTP cells in a bank;
  a plurality of bank selects to enable turning on the wordlines or bitlines in a bank; and
  wherein a plurality of OTP cells can be configured to be concurrently programmable by applying at least one voltage to at least one wordline and at least one bitline in a plurality of the banks if a plurality of the bank selects corresponding to the plurality of the banks are asserted.

17. A method for operating a programmable OTP memory, comprising:
providing a plurality of OTP cells, each including an electrical fuse element coupled to a program selector, the program selector having a control terminal;
providing a plurality of local wordlines, each coupled to a plurality of the OTP cells via the control terminal of the program selector;
providing a plurality of global wordlines, each coupled to at least one of the local wordlines;
providing a plurality bitlines arranged in banks, each bitline coupled to a plurality of the OTP cells; and
concurrently programming a plurality of selected OTP cells into a different logic state by applying voltages to at least one selected global wordlines and at least one selected bitlines in a plurality of the banks to conduct currents and change the resistance of the selected OTP cells.

18. A memory as recited in claim 17, wherein the electrical fuse element is at least one of an interconnect, a conductive contact or via, or combination thereof.

19. A memory as recited in claim 17, wherein the electrical fuse element has at least one of polysilicon, silicided polysilicon, silicide, polymetal, local interconnect, metal-0, thermally insulated active region, metal, or metal alloy, CMOS gate, or combination thereof.

20. A memory as recited in claim 17, wherein the at least one of the bank select is driven or latched from the I/O ports sharing with at least one data output port during read.

21. A memory as recited in claim 17, wherein the program selector is at least one MOS device with the MOS gate as a control terminal.

22. A memory as recited in claim 17, wherein the program selector is at least one diode having at least a first active region with a first type of dopant to provide a first terminal of the diode, and a second active region with a second type of dopant to provide a second terminal of the diode, both active regions being fabricated from sources or drains of CMOS devices and residing in a common CMOS well, the first terminal of the diode coupled to a first terminal of the electrical fuse element, the second terminal of the diode is a control terminal.

* * * * *